United States Patent
Booth

(10) Patent No.: US 11,889,760 B2
(45) Date of Patent: Jan. 30, 2024

(54) SEISMIC PRESSURE AND ACCELERATION SENSOR

(71) Applicant: PGS Geophysical AS, Oslo (NO)

(72) Inventor: David Thomas Booth, Houston, TX (US)

(73) Assignee: PGS Geophysical AS, Oslo (NO)

( * ) Notice: Subject to any disclaimer, the term of this patent is extended or adjusted under 35 U.S.C. 154(b) by 508 days.

(21) Appl. No.: 16/763,468

(22) PCT Filed: Dec. 17, 2018

(86) PCT No.: PCT/US2018/065974
§ 371 (c)(1),
(2) Date: May 12, 2020

(87) PCT Pub. No.: WO2019/118966
PCT Pub. Date: Jun. 20, 2019

(65) Prior Publication Data
US 2020/0363545 A1 Nov. 19, 2020

Related U.S. Application Data

(60) Provisional application No. 62/599,392, filed on Dec. 15, 2017.

(51) Int. Cl.
*G01V 1/16* (2006.01)
*H10N 30/30* (2023.01)
(Continued)

(52) U.S. Cl.
CPC .............. *H10N 30/302* (2023.02); *G01L 1/16* (2013.01); *G01P 15/08* (2013.01); *G01V 1/186* (2013.01);
(Continued)

(58) Field of Classification Search
CPC ........ H01L 41/1132; G01L 1/16; G01P 15/08; G01V 1/186; G01V 1/201; G01V 1/3808; G01V 2219/1423; G01V 2219/32
See application file for complete search history.

(56) References Cited

U.S. PATENT DOCUMENTS 3,202,736 A   8/1965  Horan et al.
3,832,762 A * 9/1974  Johnston ............... B06B 1/0603
                                                367/160

(Continued)

FOREIGN PATENT DOCUMENTS

AU    2003 200 979    10/2003
CA    1 030 647       5/1978
(Continued)

OTHER PUBLICATIONS

International Preliminary Report on Patentability for related PCT Application PCT/US2018/065974, dated Jun. 25, 2020 (10 pgs).
(Continued)

*Primary Examiner* — Krystine E Breier

(57) ABSTRACT

A seismic pressure and acceleration sensor can include a hydrophone having a volume encapsulated by an enclosure. The enclosure can include, a pressure-sensitive surface and a pressure-insensitive support structure. The sensor can also include an accelerometer positioned within the encapsulated volume. The accelerometer is mechanically isolated from the pressure-sensitive surface and mechanically coupled to the pressure-insensitive support structure.

17 Claims, 6 Drawing Sheets

(51) Int. Cl.
*G01V 1/18* (2006.01)
*G01V 1/38* (2006.01)
*G01L 1/16* (2006.01)
*G01P 15/08* (2006.01)
*G01V 1/20* (2006.01)

(52) U.S. Cl.
CPC ............ *G01V 1/201* (2013.01); *G01V 1/3808* (2013.01); *G01V 2210/1423* (2013.01); *G01V 2210/32* (2013.01)

(56) References Cited

U.S. PATENT DOCUMENTS

| | | | |
|---|---|---|---|
| 3,970,878 A * | 7/1976 | Berglund | B06B 1/0666 367/160 |
| 4,017,824 A | 4/1977 | Fife et al. | |
| 4,162,476 A * | 7/1979 | Fanning | B06B 1/0655 367/155 |
| 4,163,206 A | 7/1979 | Hall, Jr. | |
| 4,228,532 A | 10/1980 | Sims | |
| 4,356,423 A | 10/1982 | Gudzin | |
| 5,646,470 A | 7/1997 | de Groot | |
| 6,029,113 A | 2/2000 | Woodall | |
| 6,108,267 A | 8/2000 | Pearce | |
| 6,160,763 A | 12/2000 | Cole | |
| 6,607,050 B2 | 8/2003 | He et al. | |
| 6,725,164 B1 | 4/2004 | Bednar | |
| 6,754,136 B2 | 6/2004 | Constantinou et al. | |
| 7,424,928 B2 | 9/2008 | Cox et al. | |
| 7,800,595 B2 | 9/2010 | Hill | |
| 8,712,694 B2 | 4/2014 | Edme et al. | |
| 8,730,766 B2 * | 5/2014 | Lambert | G01V 1/36 367/178 |
| 8,838,392 B2 | 9/2014 | Halliday et al. | |
| 9,091,783 B2 | 7/2015 | Edme et al. | |
| 9,110,187 B2 | 9/2015 | Muyzert et al. | |
| 9,594,174 B2 | 3/2017 | Goujon et al. | |
| 9,989,555 B2 | 6/2018 | Keast et al. | |
| 10,241,220 B2 * | 3/2019 | Pearce | B06B 1/0688 |
| 10,534,099 B2 | 1/2020 | Tenghamn | |
| 2011/0182140 A1 | 7/2011 | Lambert et al. | |
| 2012/0163119 A1 * | 6/2012 | Pearce | G01V 1/38 367/24 |
| 2012/0163120 A1 | 6/2012 | Pearce et al. | |
| 2013/0042695 A1 * | 2/2013 | Barr | G01L 19/02 73/753 |
| 2013/0127471 A1 | 5/2013 | Sudow et al. | |
| 2015/0063062 A1 | 3/2015 | Fernihough | |
| 2015/0101731 A1 * | 4/2015 | Hepp | H10N 30/302 156/64 |
| 2017/0031040 A1 | 2/2017 | Goenner et al. | |
| 2018/0106666 A1 | 4/2018 | Tenghamn et al. | |
| 2018/0106915 A1 * | 4/2018 | Tenghamn | G01V 1/38 |
| 2018/0321419 A1 | 11/2018 | Tenghamn et al. | |
| 2018/0324507 A1 | 11/2018 | Tenghamn et al. | |
| 2018/0329094 A1 | 11/2018 | Goenner et al. | |
| 2020/0303620 A1 | 9/2020 | Tenghamn et al. | |
| 2021/0080601 A1 | 3/2021 | Fernihough | |
| 2022/0406988 A1 | 12/2022 | Tenghamn et al. | |

FOREIGN PATENT DOCUMENTS

| | | | |
|---|---|---|---|
| EP | 0 237 616 A2 | 9/1987 | |
| EP | 3 312 638 A1 | 4/2018 | |
| GB | 1 435 125 A | 5/1976 | |
| GB | 2 227 317 A | 7/1990 | |
| GB | 2227317 A * | 7/1990 | .............. G01H 3/00 |
| GB | 2493837 | 2/2013 | |
| GB | 2515658 | 12/2014 | |
| KR | 20170078382 | 7/2017 | |
| WO | WO-2015048494 A1 * | 4/2015 | .............. G01V 1/201 |

OTHER PUBLICATIONS

International Search Report & Written Opinion for related PCT Application PCT/US2018/065974, dated Apr. 12, 2019 (15 pgs).
International Preliminary Report on Patentability for PCT Application PCT/US2018065935, dated Jun. 25, 2020.
International Search Report and Written Opinion for PCT Application PCT/US2018065935, dated Mar. 18, 2019.
International Search Report and Written Opinion in PCT/EP2019/064947 dated Oct. 9, 2010.
"T-2 Hydrophone" data sheet (Teledyne Geophysical Instruments, Jun. 2006).
"T-2BX Hydrophones" data sheet (Teledyne Geophysical Instruments, May 2008).

* cited by examiner

SEISMIC PRESSURE AND ACCELERATION SENSOR

CROSS-REFERENCE TO RELATED APPLICATIONS

This application is a National Stage Application under 35 USC § 371 of International Application No. PCT/US2018/065974, filed on Dec. 17, 2018 and published as WO 2019/118966 A1 on Jun. 20, 2019, which claims the benefit of U.S. Provisional Application 62/599,392, filed Dec. 15, 2017, which is incorporated by reference in its entirety.

BACKGROUND

In the past few decades, the petroleum industry has invested heavily in the development of marine seismic survey techniques that yield knowledge of subterranean formations beneath a body of water in order to find and extract valuable mineral resources, such as from reservoirs of oil or natural gas. High-resolution images of a subterranean formation are helpful for quantitative interpretation and improved reservoir monitoring. A typical marine seismic survey includes acoustic sources, acoustic sensors, and vessels with additional survey equipment such as navigation controls, source controls, and sensor data acquisition and recording equipment. A marine survey vessel tows one or more acoustic sources below the sea surface and over a subterranean formation to be surveyed for mineral deposits. A marine acoustic source, when activated, induces an acoustic signal into the water. Each signal is essentially a packet of acoustic waves in the seismic bandwidth which propagates out from the source to create a source wavefield that travels down through the water and into the subterranean formation. At each interface between regions of differing acoustic impedance, some portions of the wavefield are refracted and reflected back into the body of water to propagate toward the sea surface as a transformed version of the original source wavefield. Source control equipment may be utilized to influence some characteristics of the source wavefield.

DETAILED DESCRIPTION

Figure 1:
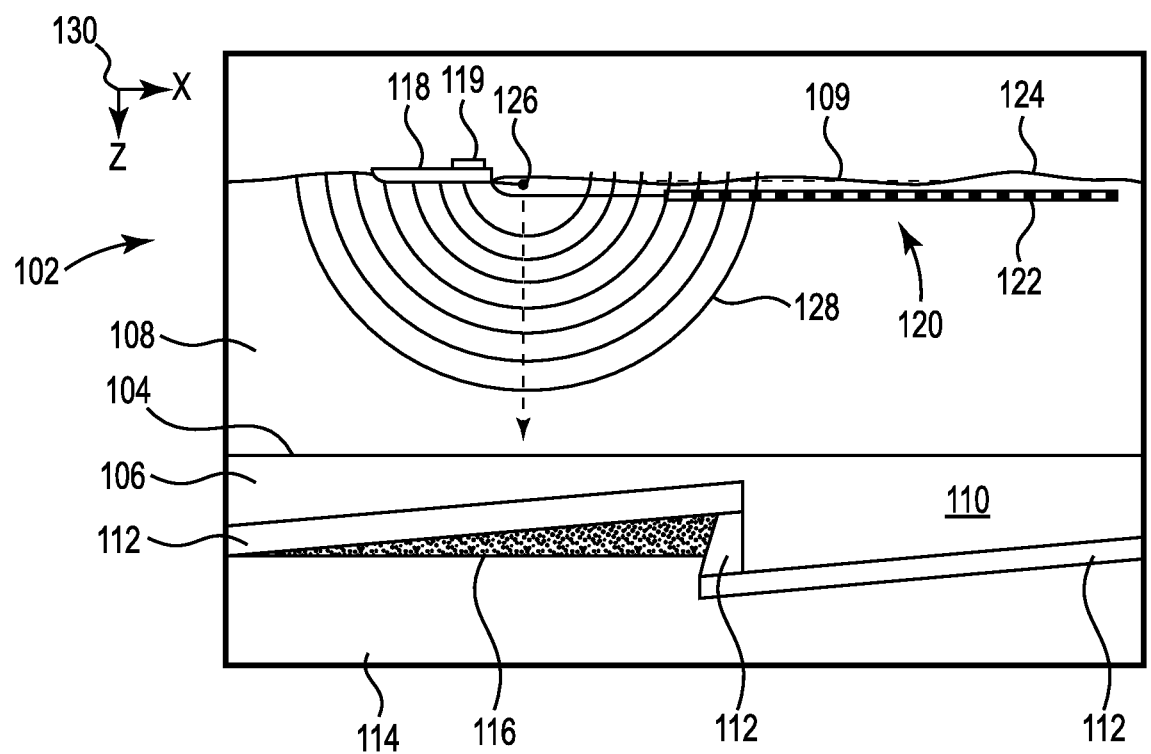
FIG. 1 is an elevation or xz-plane view of an example marine seismic survey in which signals are emitted by a marine survey source for recording by marine survey receivers.

This disclosure is related generally to the field of marine surveying. Marine surveying can include, for example, seismic and/or electromagnetic surveying, among others. For example, this disclosure may have applications in marine surveying, in which one or more source elements are used to generate wavefields, and sensors (towed and/or ocean bottom) receive energy generated by the source elements and affected by the interaction with a subsurface formation. The sensors thereby collect survey data, which can be useful in the discovery and/or extraction of hydrocarbons from subsurface formations.

Pressure and motion sensors are used in the seismic industry. Acoustic sensors may include hydrophones or particle motion sensors, such as geophones or accelerometers, or combinations thereof. Sensors may be located on or near the seafloor, on one or more streamer cables towed by the marine survey vessel, or on one or more streamers towed by another vessel. The marine acoustic sensors thereby measure the reflected wavefield. The sensor data acquisition and recording equipment collects and stores the wavefield data for quantitative interpretation. The quality of the seismic data may be improved by combining the outputs of sensors into groups to reduce noise, or by combining the outputs of pressure sensors and motion sensors to filter out false images known as "ghosts." The resolution of the seismic data may be improved by increasing the size of the arrays or the density of sensor distribution within the array.

As used herein, "hydrophone" refers to a sensor component including an active element that can deform into an enclosed volume, which can be used to measure external pressure fluctuations such as those caused by acoustic waves in the bandwidth of seismic events. As used herein, "accelerometer" refers to a sensor component including an active element that can deform in response to inertial changes, which be used to measure particle motion indicated by variations in velocity or acceleration. Active elements may comprise piezoelectric elements or structures, but may also include optical elements, micro-electro-mechanical systems (MEMS), among others. In at least one embodiment of the present disclosure, the accelerometer is contained within an enclosed volume of the hydrophone, mechanically isolated from any deforming surfaces, and thereby isolated from pressure-induced noise In some approaches, a dual sensor streamer can be used to measure pressure and acceleration. As used herein, a "dual-sensor streamer" refers to a streamer containing both hydrophone components and accelerometer components. Dual-sensor streamer cables may be used in seismic surveying to reduce motion-induced noise in hydrophone outputs. In at least one embodiment of the present disclosure, the accelerometer of the sensor may be electrically coupled to the hydrophone in such a way as to counter the motion-induced noise in the output of the hydrophone component. In at least one embodiment, examples of the present disclosure may reduce motion-induced noise in seismic data.

Dual-sensor streamer cables may be used in seismic surveying to distinguish acoustic waves reflected from the underside of the ocean surface from acoustic waves traveling upward from the ocean bottom. In at least one embodiment of the present disclosure, the accelerometer of the sensor may be electrically isolated from the hydrophone component in such a way as to provide an output representative of particle motion within the acoustic wavefield but independent of the hydrophone output representing pressure fluctuations within the acoustic wavefield. The independent outputs may be computationally combined by special seismic data processing systems to substantially "de-ghost" the survey data by filtering out those data elements produced by acoustic reflections from the underside of ocean surface. In at least one embodiment, examples may reduce or remove ghost images from seismic data. Furthermore, co-location of the sensor components as described herein may improve the spatial coherence of the independent outputs and thereby reduce spatially non-coherent noise induced into the combined data set.

To improve the rejection of spatially non-coherent noise from the output of sensor groups, some prior approaches to seismic array design increase the density of sensor distribution within sensor groups. To improve the resolution of wavefield images, other approaches to seismic array design increase the density of sensor or sensor-group distribution within the streamer cables. The density of sensor distribution may be limited by the size of the sensor carriers and a minimum allowable spacing between the sensor carriers within the streamer. In contrast, co-location of the sensor components, as described herein, may enable an increase (e.g., a doubling) of sensor distribution density within a given streamer design. Examples of the present disclosure may thereby reduce non-coherent noise in the data set and for improving wavefield image resolution.

It is to be understood that the present disclosure is not limited to particular devices or methods, which may, of course, vary. It is also to be understood that the terminology used herein is for the purpose of describing particular embodiments only and is not intended to be limiting. As used herein, the singular forms "a", "an", and "the" include singular and plural referents unless the content clearly dictates otherwise. Furthermore, the word "may" is used throughout this application in a permissive sense (having the potential to, being able to), not in a mandatory sense (must). The term "include," and derivations thereof, mean "including, but not limited to." The term "coupled" means directly or indirectly connected.

The figures herein follow a numbering convention in which the first digit or digits correspond to the drawing figure number and the remaining digits identify an element or component in the drawing. Similar elements or components between different figures may be identified by the use of similar digits. For example, 246 may reference element "46" in FIG. 2, and a similar element may be referenced as 546 in FIG. 5. Multiple analogous elements within one figure may be referenced with a reference numeral followed by a hyphen and another numeral or a letter. For example, 550-1 may reference element 50-1 in FIGS. 5 and 550-2 may reference element 50-2, which can be analogous to element 50-1. Such analogous elements may be generally referenced without the hyphen and extra numeral or letter. For example, elements 550-1 and 550-2 may be generally referenced as 550. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

FIG. 1 illustrates an elevation or xz-plane 130 view of a marine survey in which signals are emitted by a marine survey source 126 for recording by marine survey receivers 122. The recording can be used for processing and analysis in order to help characterize the structures and distributions of features and materials underlying the surface of the earth. For example, the recording can be used to estimate a physical property of a subsurface location, such as the presence of a reservoir that may contain hydrocarbons. FIG. 1 shows a domain volume 102 of the earth's surface comprising a subsurface volume 106 of sediment and rock below the surface 104 of the earth that, in turn, underlies a fluid volume 108 of water having a sea surface 109 such as in an ocean, an inlet or bay, or a large freshwater lake. The domain volume 102 shown in FIG. 1 represents an example experimental domain for a class of marine surveys. FIG. 1 illustrates a first sediment layer 110, an uplifted rock layer 112, underlying rock layer 114, and hydrocarbon-saturated layer 116. One or more elements of the subsurface volume 106, such as the first sediment layer 110 and the uplifted rock layer 112, can be an overburden for the hydrocarbon-saturated layer 116. In some instances, the overburden may include salt.

FIG. 1 shows an example of a marine survey vessel 118 equipped to carry out marine surveys. In particular, the marine survey vessel 118 can tow one or more streamers 120 (shown as one streamer for ease of illustration) generally located below the sea surface 109. The streamers 120 can be long cables containing power and data-transmission lines (e.g., electrical, optical fiber, etc.) to which marine survey receivers may be coupled. In one type of marine survey, each marine survey receiver, such as the marine survey receiver 122 represented by the shaded disk in FIG. 1, comprises a pair of sensors that detects particle displacement within the water by detecting particle motion variation, such as velocities or accelerations, and/or a hydrophone that detects variations in pressure as described herein. In one type of marine survey, each marine survey receiver, such as marine survey receiver 122, comprises an electromagnetic receiver that detects electromagnetic energy within the water. The streamers 120 and the marine survey vessel 118 can include sensing electronics and data-processing facilities that allow marine survey receiver readings to be correlated with absolute positions on the sea surface and absolute three-dimensional positions with respect to a three-dimensional coordinate system. In FIG. 1, the marine survey receivers along the streamers are shown to lie below the sea surface 109, with the marine survey receiver positions correlated with overlying surface positions, such as a surface position 124 correlated with the position of marine survey receiver 122. The marine survey vessel 118 can include a controller 119, which can be used for operations associated with a pressure and acceleration sensor as described herein.

The marine survey vessel 118 can tow one or more marine survey sources 126 that produce signals as the marine survey vessel 118 and streamers 120 move across the sea surface 109. Although not specifically illustrated, the marine survey sources 126 can include a plurality of marine non-impulsive sources above, below, or in-line with the streamer 120. Marine survey sources 126 and/or streamers 120 may also be towed by other vessels or may be otherwise disposed in fluid volume 108. For example, marine survey receivers may be located on ocean bottom cables or nodes fixed at or near the surface 104, and marine survey sources 126 may also be disposed in a nearly-fixed or fixed configuration. For the sake of efficiency, illustrations and descriptions herein show marine survey receivers located on streamers, but it should be understood that references to marine survey receivers located on a "streamer" or "cable" should be read to refer equally to marine survey receivers located on a towed streamer, an ocean bottom receiver cable, and/or an array of nodes.

FIG. 1 shows acoustic energy illustrated as an expanding, spherical signal, illustrated as semicircles of increasing radius centered at the marine survey source 126, representing a down-going wavefield 128, following a signal emitted by the marine survey source 126. The down-going wavefield 128 is, in effect, shown in a vertical plane cross section in FIG. 1. The outward and downward expanding down-going wavefield 128 may eventually reach the surface 104, at which point the outward and downward expanding down-going wavefield 128 may partially scatter, may partially reflect back toward the streamers 120, and may partially refract downward into the subsurface volume 106, becoming elastic signals within the subsurface volume 106.

Figure 2:
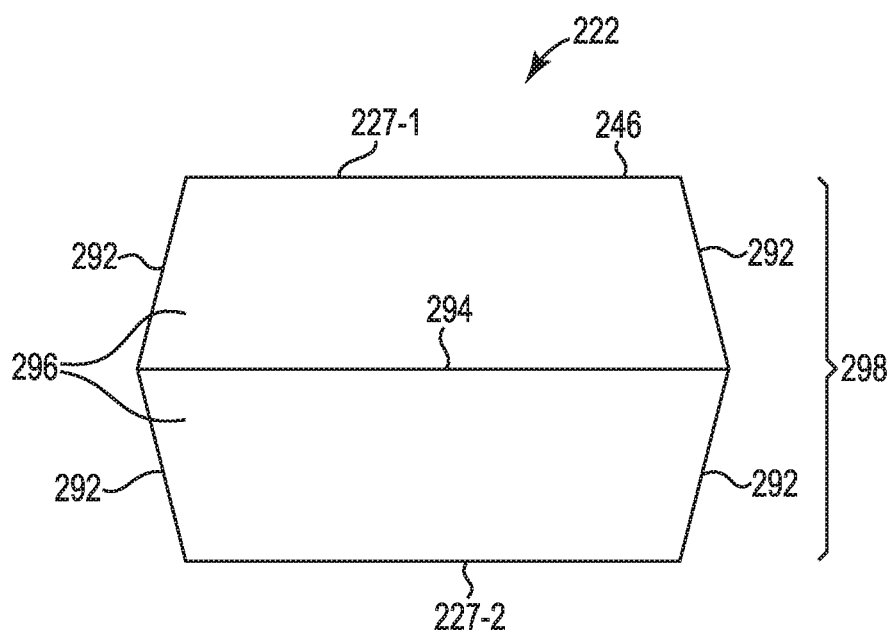
FIG. 2 illustrates a schematic diagram of an example sensor including a hydrophone and an accelerometer.

FIG. 2 illustrates a schematic diagram of an example sensor 222 including a hydrophone 298 and an accelerometer 294. In at least one embodiment, the sensor 222 is configured to be embedded in a streamer such as streamer 120 illustrated in FIG. 1. The hydrophone 298 comprises a volume 296 encapsulated by an enclosure 246, and the enclosure includes a pressure-sensitive surface 227-1 and a pressure-insensitive support structure 292. Support structure 292 serves to physically support hydrophone 298. Volume 296 comprises a space within enclosure 246 that may be occupied, for instance by an accelerometer such as accelerometer 294. The pressure-sensitive surface 227-1 can be a surface of a wall of enclosure 246 or a surface of a structure coupled to a wall of enclosure 246. For instance, pressure-sensitive surface 227-1 comprises a piezoelectric structure coupled to a wall of enclosure 246 in at least one embodiment. A single piezoelectric structure may be present, more than one piezoelectric structure may be present, or no piezoelectric structures may be present. In the latter example, the hydrophone uses sensing elements other than piezoelectric structures. The accelerometer 294 is positioned within the encapsulated volume 296 and is mechanically isolated from the pressure-sensitive surface 227-1 and mechanically coupled to the pressure-insensitive support structure 292. As used herein, "pressure-sensitive" refers to a surface that is sensitive to acoustic noise, and "pressure-insensitive" refers to a surface or structure that is not sensitive to acoustic noise. In at least one embodiment, a pressure-sensitive surface deforms or deflects above a particular threshold in response to acoustic noise, whereas a pressure-insensitive surface or structure may be rigid and does not deform or deflect or deforms or deflects below a particular threshold responsive to acoustic noise.

In at least one embodiment, the enclosure 246 includes a pair of opposing parallel walls 227 (herein after referred to as "opposing parallel walls") that are less rigid than the pressure-insensitive support structure 292. In such an example, the first wall of the opposing parallel walls 227 comprises the pressure-sensitive surface 227-1, and a second wall of the opposing parallel walls 227 comprises a different pressure-sensitive surface 227-2. In at least one embodiment, rather than the opposing walls themselves comprising a pressure-sensitive surface, the sensor 222 includes a first piezoelectric structure coupled to the first wall 227-1 and a second piezoelectric structure coupled to the second wall 227-2 such that the first piezoelectric structure comprises the pressure-sensitive surface. For instance, the sensor 222 includes a first piezoelectric structure coupled to the first wall 227-1 such that the first piezoelectric structure creates a first electrical charge differential in response to deformation of the first wall 227-1 and a second piezoelectric structure coupled the second wall 227-2 such that the second piezoelectric structure creates a second electrical charge differential in response to deformation of the second wall 227-2. In such an example, hydrophone 298 may be a bender-type hydrophone. In at least one embodiment, both a wall and a piezoelectric structure coupled to the wall comprise pressure-sensitive surfaces.

In at least one embodiment, the accelerometer 294 comprises a flexible substrate mechanically coupled to the pressure-insensitive support structure 292 and spanning an interior of the enclosure 246. In at least one embodiment, a piezoelectric structure (not illustrated in FIG. 2) is coupled to the flexible substrate such that the piezoelectric structure creates an electrical charge differential in response to deformation of the flexible substrate.

Accelerometer 294 can comprise a plurality of different types of motion sensors or accelerometers and is not limited to the types of accelerometers, piezoelectric structures, and substrates disclosed herein. For instance, accelerometer 294 can include a mechanical accelerometer, a piezoelectric accelerometer, or a capacitive accelerometer, among others. Mechanical and electrical connections, configurations, and shapes of accelerometer 294 are also not limited to the examples disclosed herein. Hydrophone 298 can comprise a plurality of different types of hydrophones and is not limited to the types of hydrophones disclosed herein. For example, hydrophone 298 can include a bender-type hydrophone or rigid hydrophone, among others. Mechanical and electrical connections, configurations, and shapes of hydrophone 298 are also not limited to the examples disclosed herein.

Figure 3:
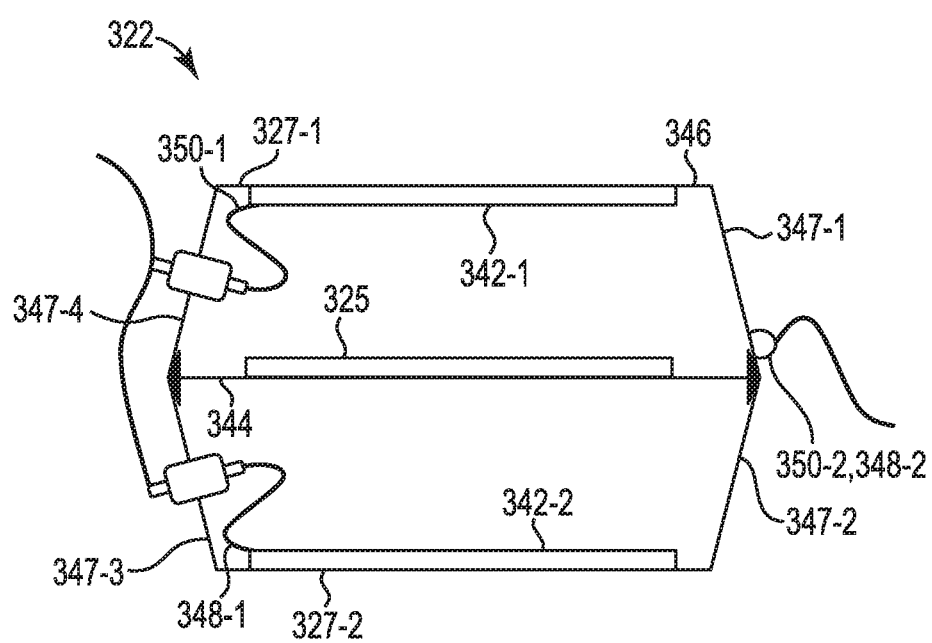
FIG. 3 illustrates a schematic diagram of an example sensor including a first piezoelectric structure, a second piezoelectric structure, and a third piezoelectric structure.

FIG. 3 illustrates a schematic diagram of an example sensor including a first piezoelectric structure 342-1, a second piezoelectric structure 342-2, and a third piezoelectric structure 325. In at least one embodiment, sensor 322 is configured to be embedded in a streamer, such as streamer 120 described with respect to FIG. 1. While sensor 322 is illustrated in FIG. 3 as a hexagon-shaped sensor, examples are not so limited. For instance, sensor 322 may be a cylindrical shape or other shape having opposing parallel walls as described herein. For instance, sensor 322 may be a cylinder having opposing parallel walls, a diaphragm, and a piezoelectric structure on each end. A flexible substrate may be inserted into the cylinder to serve as an accelerometer or an element of an accelerometer in at least one embodiment, or the cylinder may have a third piezoelectric structure such as third piezoelectric structure 325 serving as an accelerometer attached to the flexible substrate. Sensor 322, in at least one embodiment, comprises a hydrophone such as hydrophone 298 illustrated in FIG. 2 with first and second piezoelectric structures 342-1 and 342-2 and third piezoelectric structure 325 coupled to a substrate 344 of the hydrophone. First and second piezoelectric structures 342-1 and 342-2 in at least one embodiment can comprise a plurality of shapes and forms such as a disc or a flat beam, among others. Third piezoelectric structure 325 is an accelerometer or an element of an accelerometer in at least one embodiment. For example, sensor 322 includes a hydrophone having piezoelectric structures 342 while also housing third piezoelectric structure 325 which, along with substrate 344, comprise an accelerometer.

In at least one embodiment, sensor 322 is subject to external pressure that is greater than an internal pressure of the hydrophone. The hydrophone can be analogous to or a component of the receiver 122 illustrated in FIG. 1. The hydrophone can include piezoelectric structures that deflect in response to pressure, such as in a bender-type hydrophone. FIG. 3 shows the hydrophone including a first piezoelectric structure 342-1 and a second piezoelectric structure 342-2 located within an enclosure 346. For instance, the hydrophone includes an air-tight volume, such as volume 296 described with respect to FIG. 2, encapsulated by enclosure 346, which may also be air-tight. The enclosure 346 can comprise a metal such as brass, but in at least one embodiment, enclosure 346 is a non-metal. Enclosure 346 includes opposing parallel walls 327-1 and 327-2 and a substrate 344 spanning an interior of enclosure 346. Substrate 344 is mechanically coupled to a different wall 347 of the enclosure 346. For instance, the different wall 347 to which substrate 344 is attached is a wall that is more rigid than the opposing parallel walls 327. Substrate 344 can span the interior of enclosure 346. For instance, in at least one embodiment, substrate 344 is mechanically coupled to the different wall 347-1, 347-2, or both, as well as wall 347-3, 347-4, or both. Substrate 344, in at least one embodiment is a beam, cantilever, or other structure mechanically coupled to a wall of the enclosure 346 such as the different wall 347. Substrate 344 is in the same plane as first and second walls 327, is positioned between first and second walls 327, or is a combination thereof.

Different walls 347, in at least one embodiment, comprise a support structure of enclosure 346, such as support structure 292 as described with respect to FIG. 2. Substrate 344, for instance, spans an interior of enclosure 346 and is mechanically coupled to the support structure. In at least one embodiment, different walls 347 comprise a pressure-insensitive support structure, while first and second walls 327 comprise pressure-sensitive surfaces.

In at least one embodiment, substrate 344 is a flexible substrate. In such an example, substrate 344, when agitated, flexes third piezoelectric structure 325 creating a charge on one side of third piezoelectric structure 325 that is positive, and a charge on the opposite side of third piezoelectric structure 325 that is negative, which serves as a signal in response to acceleration such as acceleration. Substrate 344 in at least one embodiment is isolated from pressure changes such that there is approximately equal pressure on each side of substrate 344. For instance, if enclosure 346 is pressurized, pressure on each side of substrate 344 is approximately equal.

Substrate 344 may or may not comprise an electrically conductive material, and substrate 344 may or may not be electrically coupled to enclosure 346. For instance, in at least one embodiment, a ceramic interface is present between substrate 344 and one or two walls 347 of enclosure 346. When a ceramic interface is present, substrate 344 is isolated from the respective wall 347 of enclosure 346. In at least one embodiment, substrate 344 is electrically coupled to enclosure 346 with no ceramic interface or ceramic interfaces present. In an example in which substrate 344 is electrically coupled to enclosure 346, substrate 344 and enclosure 346 share a common ground.

The first piezoelectric structure 342-1 and the second piezoelectric structure 342-2 can each comprise a piezoelectric material such as a piezoceramic, but examples are not limited to a piezoceramic. The first piezoelectric structure 342-1 is coupled to a first wall 327-1 of the opposing parallel walls 327 such that the first piezoelectric structure 342-1 creates a first electrical charge differential in response to deformation of the first wall 327-1. The second piezoelectric structure 342-2 is coupled to first wall 327-2 of the opposing parallel walls 327 such that the second piezoelectric structure 342-2 creates a second electrical charge differential in response to deformation of the first wall 327-2. The coupling, in at least one embodiment, can including coupling via a conductive or non-conductive solder joint (not illustrated in FIG. 3). Other coupling approaches may be used.

In at least one embodiment, the first piezoelectric structure 342-1, the second piezoelectric structure 342-2, or both, are electrically coupled to the enclosure 346 and share a common ground. If both the first piezoelectric structure 342-1 and the second piezoelectric structure 342-2 are electrically coupled to the enclosure 346, they share a common ground with one another and with enclosure 346.

Sensor 322 can include a third piezoelectric structure 325, which in at least one embodiment comprises an accelerometer or an element of an accelerometer. The third piezoelectric structure 325 can comprise a piezoelectric material such as a piezoceramic, but embodiments are not so limited. The third piezoelectric structure 325 is coupled to a surface of the substrate 344 such that the third piezoelectric structure 325 creates a third electrical charge differential in response to deformation of the substrate 344. In at least one embodiment, the third piezoelectric structure 325 is electrically coupled, for instance via an electrically conductive solder joint, to the substrate 344. Other coupling approaches may be used. In such an example, if the substrate 325 is electrically coupled to enclosure 346, the third piezoelectric structure 325 shares a common ground with the enclosure 346.

The third piezoelectric structure 325 is positioned between the first piezoelectric structure 342-1 and the second piezoelectric structure 342-2 in at least one embodiment. However, third piezoelectric structure 325 may be located in a different location relative to the first piezoelectric structure 342-1 and the second piezoelectric structure 342-2 and within enclosure 346 in at least one embodiment. In at least one embodiment, the first piezoelectric structure 342-1, the second piezoelectric structure 342-2, and the third piezoelectric structure 325 are axially aligned.

In at least one embodiment, sensor 322 includes a first electrical connection 350-1 and a second electrical connection 350-2 to the first piezoelectric structure 342-1 and a third electrical connection 348-1 and a fourth electrical connection 348-2 to the second piezoelectric structure 342-2. The second electrical connection 350-2 and the fourth electrical connection 348-2 can be located in the same location, as illustrated in FIG. 3, or in different locations. In at least one embodiment, second electrical connection 350-2 is formed by electrically coupling the first piezoelectric structure 342-1 and the second piezoelectric structure 342-2 to enclosure 346. In at least one embodiment, the electrical connections 350 of the first piezoelectric structure 342-1 are independent of the electrical connections 348 of the second piezoelectric structure 342-2 because none of the electrical connections is coupled to both the first piezoelectric structure 342-1 and the second piezoelectric structure 342-1.

The first electrical connection 350-1, in at least one embodiment, conducts charge to and from a surface of the first piezoelectric structure 342-1 not coupled to first wall 327-1. The second electrical connection 350-2, in at least one embodiment, conducts charge to and from a surface of the first piezoelectric structure 342-1 coupled to first wall 327-1. The third electrical connection 348-1, in at least one embodiment, conducts charge to and from a surface of the second piezoelectric structure 342-2 that is not coupled to a wall of enclosure 346. The fourth electrical connection 348-2, in at least one embodiment, conducts charge to and from a surface of the second piezoelectric structure 342-2 that is coupled to a wall of enclosure 346. In at least one embodiment, enclosure 346 comprises an electrically conductive material and is coupled to the first piezoelectric structure 342-1 and the second piezoelectric structure 342-2. As a result, in such an example, enclosure 346 serves as a join of the second electrical connection 350-2 and the fourth electrical connections 348-2.

A piezoelectric structure such as first piezoelectric structure 342-1, second piezoelectric structure 342-2, and third piezoelectric structure 325 comprising a piezoelectric material can generate an electric potential in response to a surface thereof being subjected to an external force. An example of the external force is pressure is force over area. Pressure, such as compressive pressure, includes an increase in pressure versus a previous state. Another example of the external force can result from acceleration, such as a unilateral force resulting from acceleration. In at least one embodiment, a piezoelectric structure such as first piezoelectric structure 342-1, second piezoelectric structure 342-1, and third piezoelectric structure 325 deflect relative to enclosure 346 responsive to the external force.

For instance, first piezoelectric structure 342-1 and second piezoelectric structure 342-2 may deflect inwards to enclosure 346 responsive to pressure, which results in first piezoelectric structure 342-1 and second piezoelectric structure 342-1 deflecting in opposite directions. Third piezoelectric structure 325 may deflect towards either opposing parallel wall 327 responsive to acceleration, for instance in the form of acceleration. First piezoelectric structure 342-1, second piezoelectric structure 342-2, and third piezoelectric structure 325 are subjected to pressure only, acceleration only, or a combination of pressure and acceleration. For example, if the sensor 322 is a component of a receiver of a streamer, the sensor 322 can be subjected to pressure from a reflected wavefield as well as vibration in the streamer. Vibration in the streamer can be caused by the reflected wavefield or waves in the water, which in turn can subject the sensor 322 to acceleration.

Figure 4:
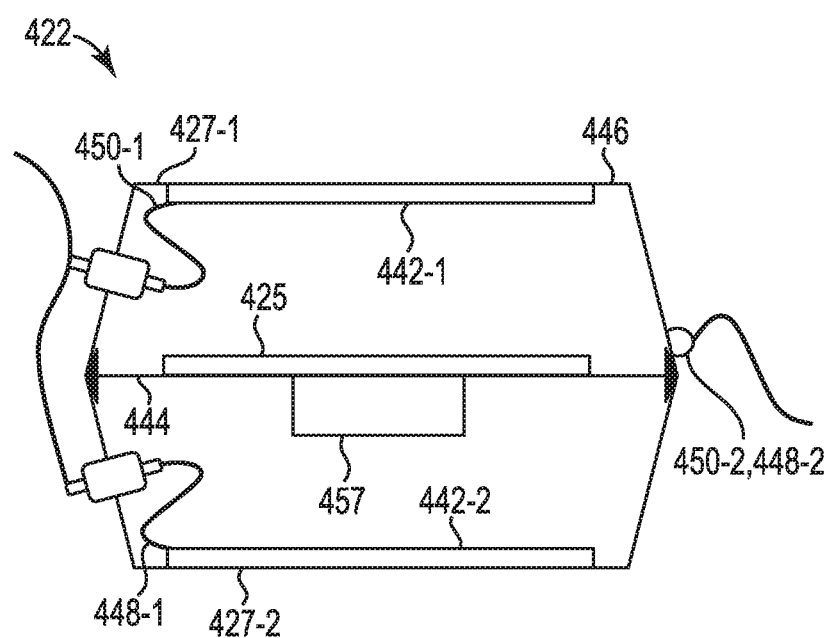
FIG. 4 illustrates a schematic diagram of an example sensor including a first piezoelectric structure, a second piezoelectric structure, a third piezoelectric structure, and a weight.

FIG. 4 illustrates a schematic diagram of an example sensor 422 including a first piezoelectric structure 442-1, a second piezoelectric structure 442-2, a third piezoelectric structure 425, and a weight 457. Sensor 422 comprises a volume encapsulated by enclosure 446 having opposing parallel walls 427. Enclosure 446, in at least one embodiment, is air-tight. For instance, enclosure 446 may be hermetically sealed. Parallel walls 427, in at least one embodiment are of equal size and rigidity or approximately equal size and rigidity but are less rigid as compared other walls of enclosure 446. The other walls of enclosure 446 make up the support structure 292 as described with respect to FIG. 2 in at least one embodiment. As used herein, "approximately" can include a value within a particular margin, range, and/or threshold.

Enclosure 346 houses first piezoelectric structure 442-1, second piezoelectric structure 442-1, and third piezoelectric structure 425. In at least one embodiment, first piezoelectric structure 442-1 and second piezoelectric structure 442-2 comprise a hydrophone or elements of a hydrophone, and third piezoelectric structure 425 is an accelerometer or an element of an accelerometer. First piezoelectric structure 442-1 is mechanically coupled to first parallel wall 427-1 such that the first piezoelectric structure 442-1 creates an electrical charge differential in response to deformation of first parallel wall 427-1. Second piezoelectric structure 442-2 is mechanically coupled to the interior of second parallel wall 427-2 such that the second piezoelectric structure 442-2 creates an electrical charge differential in response to deformation of second parallel wall 427-2. While two piezoelectric structures 442 are illustrated in FIG. 4, embodiments are not so limited. For instance, a single piezoelectric structure may be present, more than two piezoelectric structures may be present, or no piezoelectric structures. In the latter example, the hydrophone uses sensing elements other than piezoelectric structures.

In at least one embodiment, sensor 422 includes a first electrical connection 450-1 and a second electrical connection 450-2 to the first piezoelectric structure 442-1 and a third electrical connection 448-1 and a fourth electrical connection 448-2 to the second piezoelectric structure 442-2 as describe with respect to electrical connections 350 and 348 of FIG. 3. In at least one embodiment, weight 457 can be coupled to substrate 444 third piezoelectric structure 425. Weight 457 can add sensitivity to the sensor 422 and improve performance of signal readings.

Figure 5:
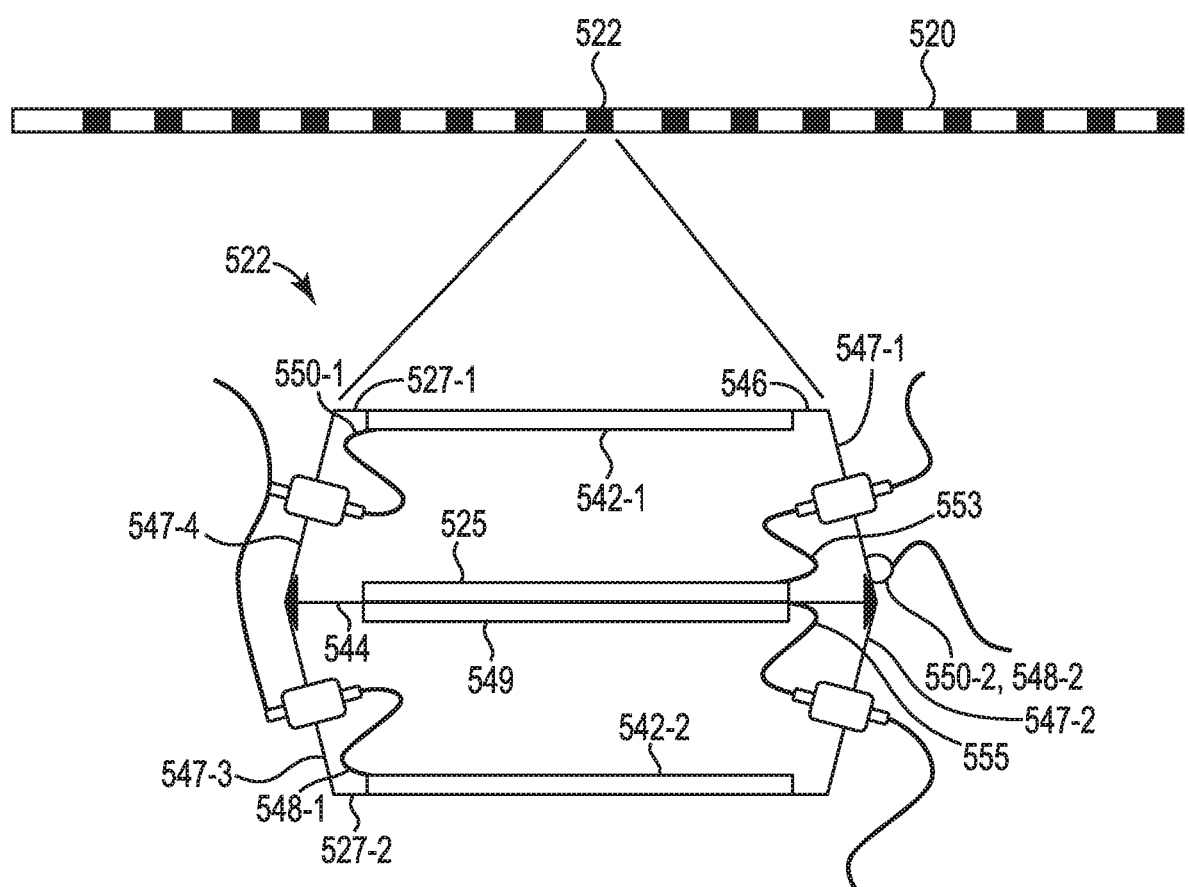
FIG. 5 illustrates a diagram of an example system including a streamer and a sensor.

FIG. 5 illustrates a diagram of an example system including a streamer 520 and a sensor 522. The system includes streamer 520 having a plurality of receivers comprising sensors 552. FIG. 5 illustrates an exploded view of sensor 522. In at least one embodiment, sensor 522 comprises a hydrophone with a volume, which may be air-tight, encapsulated by an air-tight enclosure 546 composed of electrically conductive material. Enclosure 546, in such an example, comprises opposing parallel walls 527 having pressure-sensitive surfaces such as piezoelectric structures 542 separated by a pressure-insensitive support structure more rigid than the opposing parallel walls 527. The pressure-insensitive support structure includes walls of the enclosure 546 exclusive of first and second walls 527. Sensor 522, in at least one embodiment, includes an accelerometer positioned within the encapsulated volume. The accelerometer is mechanically isolated from the pressure-sensitive surface or surfaces and is mechanically coupled to the pressure-insensitive support structure. The accelerometer includes a flexible substrate such as substrate 544 that spans an interior of enclosure 546 and is mechanically coupled to the support structure, and the accelerometer also includes third piezoelectric structure 525 coupled to substrate 544. In at least one embodiment, substrate 544, along with third piezoelectric structure 525, fourth piezoelectric structure 549, or a combination thereof may comprise an accelerometer.

The first piezoelectric structure 542-1 is coupled to first wall 527-1 of the opposing parallel walls 527 such that the first piezoelectric structure 542-1 creates a first electrical charge differential in response to deformation of the first wall 527-1. The second piezoelectric structure 542-2 is coupled to first wall 527-2 of the opposing parallel walls 527 such that the second piezoelectric structure 542-2 creates a second electrical charge differential in response to deformation of the first wall 527-2. While piezoelectric structures 527 are illustrated as being coupled to the interiors of walls 527 of enclosure 546, embodiments are not so limited. For instance, one or more piezoelectric structures may be coupled to exteriors of walls 527 or other enclosure walls or may be located in a different location relative to walls 527 or other enclosure walls.

Sensor 522 can include a third piezoelectric structure 525 coupled to a surface of the substrate 544 such that the third piezoelectric structure 525 creates a third electrical charge differential in response to deformation of the substrate 544. In at least one embodiment, sensor 522 includes a first electrical connection 550-1 and a second electrical connection 550-2 to the first piezoelectric structure 542-1 and a third electrical connection 548-1 and a fourth electrical connection 548-2 to the second piezoelectric structure 542-2 as describe with respect to electrical connections 350 and 348 of FIG. 3.

In at least one embodiment, sensor 522 includes a fifth electrical connection 553 that is coupled to the third piezoelectric structure 525 to conduct charge to and from the third piezoelectric structure 525 when the third piezoelectric structure 525 is not electrically coupled the substrate 544. A sixth electrical connection 555 is present in at least one embodiment. The sixth electrical 555 connection is coupled to the third piezoelectric structure 525 to conduct charge to and from the third piezoelectric structure 525. In such an example, the third piezoelectric structure 525 is coupled to the substrate 544.

In at least one embodiment, sensor 522 includes a fourth piezoelectric structure 549 mechanically coupled to the substrate 544 on an opposite side of the third piezoelectric structure 525. The fourth piezoelectric structure 549, in at least one embodiment, includes a seventh electrical connection and an eighth electrical connection (not illustrated in FIG. 5). In at least one embodiment, substrate 544 comprises an electrically conductive material, is coupled to the third piezoelectric structure 525 and the fourth piezoelectric structure 549 and forms the sixth electrical connection 555 and the eighth electrical connection. In at least one embodiment, enclosure 546 and substrate 544 comprise electrically conductive materials and are electrically coupled to one another. In such an example, the coupling serves as a join of the second electrical connection 550-2, the fourth electrical connection 548-2, the sixth electrical connection 555, and the eighth electrical connection. In at least one embodiment, the eighth electrical connection is not present, but the aforementioned joins may still be present without the eighth electrical connection.

Figure 6:
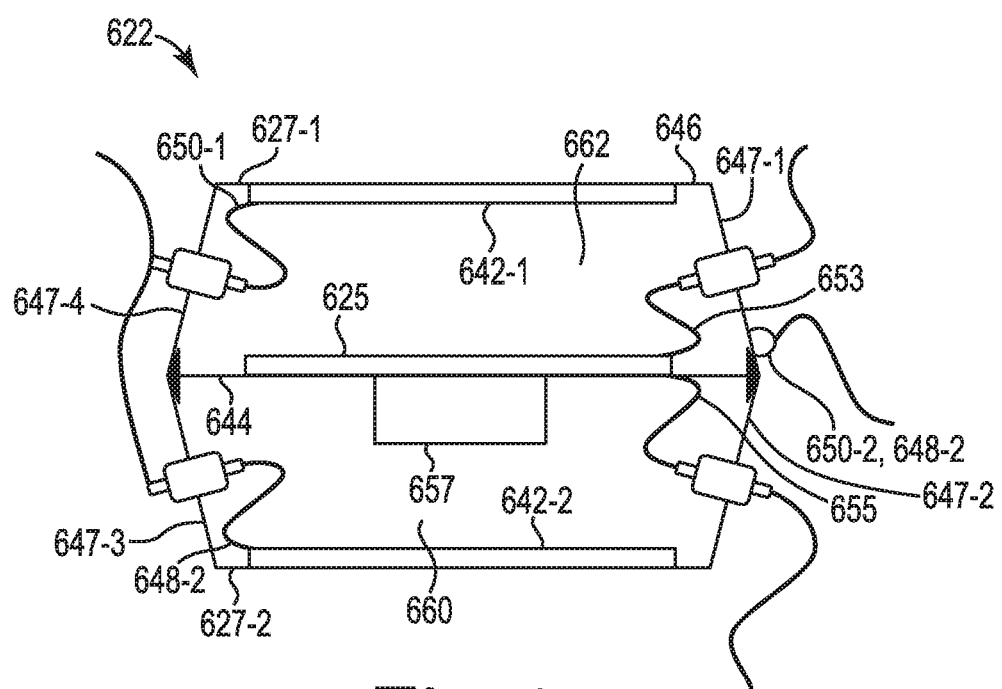
FIG. 6 illustrates a schematic diagram of another example sensor including a first piezoelectric structure, a second piezoelectric structure, a third piezoelectric structure, and a weight.

FIG. 6 illustrates a schematic diagram of another example sensor 622 including a first piezoelectric structure 642-1, a second piezoelectric structure 642-1, a third piezoelectric structure 625, and a weight 657. In at least one embodiment, sensor 622 is configured to be embedded in a streamer, such as streamer 120 illustrated in FIG. 1 and streamer 520 illustrated in FIG. 5. FIG. 6 illustrates a first piezoelectric structure 642-1, a second piezoelectric structure 642-2, and a third piezoelectric structure 625 located within an enclosure 646. Enclosure 646 includes opposing parallel walls 627 and a substrate 644 spanning an interior of enclosure 646. Substrate 644 is mechanically coupled to a different wall 647 of the enclosure. In at least one embodiment substrate 644 is a flexible substrate.

The first piezoelectric structure 642-1 is coupled to first wall 627-1 of the opposing parallel walls 627, and the second piezoelectric structure 642-2 is coupled to second wall 627-2 of the opposing parallel walls 627. Sensor 622 includes third piezoelectric structure 625, which in at least one embodiment comprises an accelerometer or an element of an accelerometer. The third piezoelectric structure 625 is coupled to a surface of the substrate 644, which in at least one embodiment is a flexible substrate.

In at least one embodiment, sensor 622 includes a first electrical connection 650-1 and a second electrical connection 650-2 to the first piezoelectric structure 642-1 and a third electrical connection 648-1 and a fourth electrical connection 648-2 to the second piezoelectric structure 642-2 as describe with respect to electrical connections 350 and 348 of FIG. 3. While such electrical connections are illustrated in FIGS. 3, 4, 5, and 6, more or fewer electrical connections may be present, and electrical connections may differ from those illustrated and described with respect to FIGS. 3, 4, 5, and 6. In at least one embodiment, sensor 622 includes a fifth electrical connection 653, a sixth electrical connection 655, or a combination of the two connections coupled to the third piezoelectric structure 625, as described with respect to electrical connections 553 and 555 of FIG. 5.

In at least one embodiment, sensor 622 includes a weight 657. Weight can be located in a first chamber 660 of enclosure 646. While weight 657 is illustrated in the first chamber 660 in FIG. 6, weight 657 may be located in a different chamber, such as second chamber 662. In the example illustrated in FIG. 6, the first chamber 660 includes first piezoelectric structure 642-1, which may be a hydrophone or element of a hydrophone, and the second chamber 662 includes second piezoelectric structure 642-2, which may be a hydrophone or element of a hydrophone. Examples are not limited to such a hydrophone arrangement. The weight 657 can be coupled to substrate 644 in at least one embodiment. In another embodiment, weight 657 can be coupled to third piezoelectric structure 625. Weight 657 can add sensitivity to the sensor and improve performance of signal readings.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Various advantages of the present disclosure have been described herein, but embodiments may provide some, all, or none of such advantages, or may provide other advantages.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A seismic pressure and acceleration sensor, comprising:
   an enclosure that includes a first wall, a second wall, and a substantially rigid support structure having first and second ends, wherein each of the first wall and the second wall is flexible and substantially planar, and wherein the first end of the support structure couples to the first wall along a periphery of the first wall and the second end of the support structure couples to the second wall along a periphery of the second wall, such that the first wall and the second wall are disposed on opposite ends of the support structure, a plane of the first wall and a plane of the second wall are parallel with one another, and the first wall, the second wall, and the support structure together enclose an interior volume;
   a first pressure sensing device coupled to an interior side of the first wall;
   a second pressure sensing device coupled to an interior side of the second wall;
   a flexible substrate coupled to an interior side of the support structure and extending away therefrom into the interior volume between the first wall and the second wall, such that a plane of the substrate is parallel with the plane of the first wall and parallel with the plane of the second wall;
   an accelerometer disposed on the substrate;

at least a first electrical connection accessible on an exterior of the enclosure and configured to carry a hydrophone signal derived from at least one of the first pressure sensing device and the second pressure sensing device; and at least a second electrical connection accessible on the exterior of the enclosure and configured to carry an acceleration signal derived from the accelerometer.

2. The sensor of claim 1, wherein at least one of the first pressure sensing device and the second pressure sensing device comprises a piezoelectric structure.

3. The sensor of claim 1, wherein:
the substrate is coupled to the support structure on opposite sides of the interior volume such that the substrate spans entirely across the interior volume.

4. The sensor of claim 1, wherein the accelerometer comprises a piezoelectric structure.

5. The sensor of claim 1, wherein the sensor is configured to be embedded in a marine streamer.

6. The sensor of claim 1, further comprising:
a weight disposed on the substrate.

7. The sensor of claim 1, wherein:
the substrate is cantilevered in the interior volume.

8. The sensor of claim 1, wherein:
the substrate is electrically isolated from the support structure by a ceramic interface disposed between the substrate and the interior side of the support structure.

9. A seismic dual sensor, comprising:
an enclosure that includes a first wall, a second wall, and a substantially rigid support structure having first and second ends;
wherein each of the first wall and the second wall is flexible and substantially planar, and wherein the first end of the support structure couples to the first wall along a periphery of the first wall and the second end of the support structure couples to the second wall along a periphery of the second wall, such that the first wall and the second wall are disposed on opposite ends of the support structure, a plane of the first wall and a plane of the second wall are parallel with one another, and the first wall, the second wall, and the support structure together enclose an interior volume;
a flexible substrate coupled to an interior side of the support structure and extending away therefrom into the interior volume between the first wall and the second wall, such that a plane of the substrate is parallel with the plane of the first wall and parallel with the plane of the second wall;
a first piezoelectric structure disposed on an interior side of the first wall;
a second piezoelectric structure disposed on an interior side of the second wall;
at least a first electrical connection accessible on an exterior of the enclosure and configured to carry a hydrophone signal derived from at least one of the first piezoelectric structure and the second piezoelectric structure;
a motion sensor disposed on the substrate; and
at least a second electrical connection accessible on the exterior of the enclosure and configured to carry a motion sensor signal derived from the motion sensor.

10. The sensor of claim 9, wherein:
the motion sensor comprises an accelerometer.

11. The sensor of claim 9, wherein:
the motion sensor comprises a third piezoelectric structure.

12. The sensor of claim 9, further comprising:
a weight disposed on the substrate.

13. The sensor of claim 9, wherein:
the substrate is coupled both to a first interior side of the support structure and to a second interior side of the support structure opposite the first interior side, such that the substrate spans an entire length of the interior volume from the first interior side to the second interior side.

14. The sensor of claim 9, further comprising:
a fourth piezoelectric structure disposed on the substrate on an opposite side thereof from the third piezoelectric structure.

15. The sensor of claim 9, wherein:
the substrate comprises an electrically conductive material and is electrically isolated from the support structure by a ceramic interface disposed between the substrate and the interior side of the support structure.

16. The sensor of claim 9, wherein:
the substrate is cantilevered in the interior volume.

17. The sensor of claim 14, wherein:
the motion sensor comprises both the third piezoelectric structure and the fourth piezoelectric structure.

* * * * *